United States Patent [19]

Kovats

[11] Patent Number: 4,953,006
[45] Date of Patent: Aug. 28, 1990

[54] PACKAGING METHOD AND PACKAGE FOR EDGE-COUPLED OPTOELECTRONIC DEVICE

[75] Inventor: Tibor F. I. Kovats, Ottawa, Canada

[73] Assignee: Northern Telecom Limited, Montreal, Canada

[21] Appl. No.: 385,599

[22] Filed: Jul. 27, 1989

[51] Int. Cl.[5] .............................. H01L 39/02
[52] U.S. Cl. ...................... 357/80; 357/74; 357/72; 357/17; 372/43; 372/55
[58] Field of Search ............ 357/80, 74, 17 L, 72; 437/206, 207, 214, 217, 220, 906; 372/43, 55

[56] References Cited

U.S. PATENT DOCUMENTS

| | | | |
|---|---|---|---|
| 3,715,635 | 2/1973 | Michel et al. | 357/73 |
| 4,351,051 | 9/1982 | Van Alem et al. | 357/74 |
| 4,366,492 | 12/1982 | Kitamura | 357/74 |
| 4,394,679 | 7/1983 | Hawrylo | 357/74 |
| 4,410,874 | 10/1983 | Scapple et al. | 174/52.4 |
| 4,517,584 | 5/1985 | Matsushito et al. | 357/81 |
| 4,567,598 | 1/1986 | Noguchi et al. | 357/74 |
| 4,635,165 | 1/1987 | Okuaki | 174/52.4 |
| 4,650,285 | 3/1987 | Stevenson | 357/80 |
| 4,811,350 | 3/1989 | Yamamoto et al. | 357/74 |

FOREIGN PATENT DOCUMENTS

| | | | |
|---|---|---|---|
| 55-86144 | 6/1980 | Japan | 357/74 |
| 57-106091 | 7/1982 | Japan | 372/43 |
| 58-111387 | 7/1983 | Japan | 372/43 |
| 0117789 | 6/1985 | Japan | 357/74 |
| 0080840 | 4/1986 | Japan | 357/74 |
| 0145876 | 7/1986 | Japan | 357/17 L |
| 0253872 | 11/1986 | Japan | 357/17 L |
| 62-71289 | 4/1987 | Japan | 372/43 |
| 62-260384 | 11/1987 | Japan | 372/43 |
| 62-269349 | 11/1987 | Japan | 357/74 |
| 63-219149 | 9/1988 | Japan | 357/74 |
| 63-228741 | 9/1988 | Japan | 357/74 |
| 0017453 | 1/1989 | Japan | 357/74 |

Primary Examiner—Rolf Hille
Assistant Examiner—Minh L. Tran
Attorney, Agent, or Firm—C. W. Junkin

[57] ABSTRACT

An edge-coupled optoelectronic device is mounted in a TO-style package which comprises a substrate assembly, a circular header and a cylindrical cap. A substrate and an insulating cover of the substrate assembly extend through an opening of the circular header and are secured in that opening. The optoelectronic device is secured to the substrate at a device support location. Electrical conductors are wire-bonded at contacts of the optoelectronic device and at corresponding device contacts of the substrate assembly to electrically connect the contacts of the optoelectronic device to respective conductors of the substrate assembly. The cylindrical cap is secured onto the header over the optoelectronic device.

13 Claims, 1 Drawing Sheet

PACKAGING METHOD AND PACKAGE FOR EDGE-COUPLED OPTOELECTRONIC DEVICE

FIELD OF THE INVENTION

This invention relates generally to packaging methods and packages for optoelectronic devices. More particularly, this invention relates to packaging methods and packages for edge-coupled optoelectronic devices, such as edge-emitting semiconductor lasers, edge-emitting Light Emitting Diodes (LEDs), and edge-receiving semiconductor photodetectors.

BACKGROUND OF THE INVENTION

"TO packages" are commonly used for a variety of electronic and optoelectronic devices. A TO package has a circular metallic header having a lip on its outer circumference and a plurality of through holes spaced around its circumference. A terminal pin extends through each hole and is held in the hole and separated from the header by an insulating spacer. The TO package also has a cylindrical cap which fits onto the header with a circular edge of the cap mating with the lip of the header. In TO packages intended for use with optoelectronic devices, the cap has a transparent window which is located over the header when the cap is installed on the header. TO packages come in several TO-standard diameters with several TO-standard pin counts.

A surface-coupled optoelectronic device, such as a surface-emitting laser, a surface-emitting LED, or a surface-receiving photodetector is mounted in a TO package by securing to the header a substrate on which the device is formed, wire-bonding electrical connections from the terminal pins to contact pads on an upper surface of the device, mating the cap with the header, and sealing the cap to the header at the lip of the header. In the packaged device, the window of the cap is aligned with the surface of the device, so that the device can be optically coupled to external components through the window.

However, if an edge-coupled optoelectronic device, such as an edge-emitting laser, an edge-emitting LED or an edge-receiving photodetector were mounted in a TO package as described above for a surface-coupled optoelectronic device, the device would not be properly oriented for optical coupling through the window. The edge-coupled device must be mounted perpendicular to the header for optical coupling through the window.

The required perpendicular mounting is conventionally achieved by securing a block to the surface of the header, and securing the edge-coupled device to a lateral surface of the block. Electrical connections are wire-bonded to contact pads of the device but, because the wire-bonding surfaces of the terminal pins are perpendicular to the contact pads of the device when the device is mounted perpendicular to the header, the electrical connections cannot be wire-bonded to the terminal pins. Instead the electrical connections must be connected to the terminal pins with solder or conductive epoxy. Unlike wire-bonding which can be totally automated, the soldering or epoxying operation is performed manually. The cap is then fixed to the header with the window over the edge of the edge-coupled device.

The requirement for a manual soldering or epoxying operation significantly increases the production time and cost associated with the packaging of edge-emitting optoelectronic devices in TO packages.

Edge-coupled optoelectronic devices have also been mounted in "flat pack" or "butterfly" packages having optical connectors or optical fiber pigtails built into an end wall of the package for optical coupling to the edge-coupled device. In these packages, contact pads of the devices can be wire-bonded to terminal pins of the packages in an automated wire-bonding operation. However, these packages are several times more expensive than TO packages. Moreover, TO packages are standardized for many cost-sensitive applications and are compatible with readily available and inexpensive connector adaptors.

Thus, there is a need for a simpler method for mounting an edge-coupled optoelectronic device in a "TO-style" package and a need for a "TO-style" package adapted to such a method.

SUMMARY OF THE INVENTION

One aspect of this invention provides a novel TO-style package for an edge-coupled optoelectronic device. The package comprises a substrate assembly, a circular header, and a cylindrical cap. The substrate assembly comprises an electrically insulating substrate, electrical conductors which are supported by the substrate and electrically insulating cover. The conductors define and extend between device contacts which are adjacent to a device support location on the substrate and terminal contacts which are remote from the device support location. The electrically insulating cover extends across the conductors between the device contacts and the terminal contacts. The circular header has a through opening for receiving the substrate and cover of the substrate assembly. The cylindrical cap fits onto the header over the substrate assembly and has a central transparent window.

Another aspect of this invention provides a novel method for mounting an edge-coupled optoelectronic device in a TO-style package. The method comprises providing a substrate assembly, a circular header and a cylindrical cap as defined above, with the substrate and cover of the substrate assembly extending through and secured in the opening of the circular header. The method further comprises securing the optoelectronic device to the substrate at the device support location, bonding electrical conductors at contacts of the optoelectronic device and at corresponding device contacts of the substrate assembly to electrically connect the contacts of the optoelectronic device to respective conductors of the substrate assembly, and securing the cylindrical cap onto the header over the optoelectronic device.

The inventive package and packaging method permit electrical connection of an edge-coupled optoelectronic device to terminals of a TO-style package without time consuming and expensive manual soldering or epoxying operations. In particular, the inventive package and packaging method permit electrical connection of an edge-coupled optoelectronic device to terminals of a TO-style package using only automated bonding operations such as wire-bonding and Tape Automated Bonding (TAB).

Another aspect of the invention provides a packaged edge-coupled optoelectronic device. The packaged device comprises a circular header, a substrate assembly, the edge-coupled optoelectronic device, and a cylindrical cap. The header has a through opening. The substrate assembly comprises an electrically insulating substrate, electrical conductors which are supported by the substrate, and an electrically insulating cover. The conductors define device contacts which are adjacent to a device support location on the substrate and terminal contacts which are remote from the device support location. The conductors also extend between the device contacts and the terminal contacts. The electrically insulating cover extends across the conductors between the device contacts and the terminal contacts. The substrate and the cover extend through and are secured in the opening of the header. The edge-coupled optoelectronic device is secured to the substrate in the device support location. The optoelectronic device has electrical contacts which are electrically connected to respective conductors of the substrate assembly. The cylindrical cap is secured to the header over the optoelectronic device. The cap has a central transparent window over the optoelectronic device.

BRIEF DESCRIPTION OF THE DRAWING

Embodiments of the invention are described below by way of example only. The description refers to accompanying drawings, in which.

DESCRIPTION OF EMBODIMENTS

Figure 1:
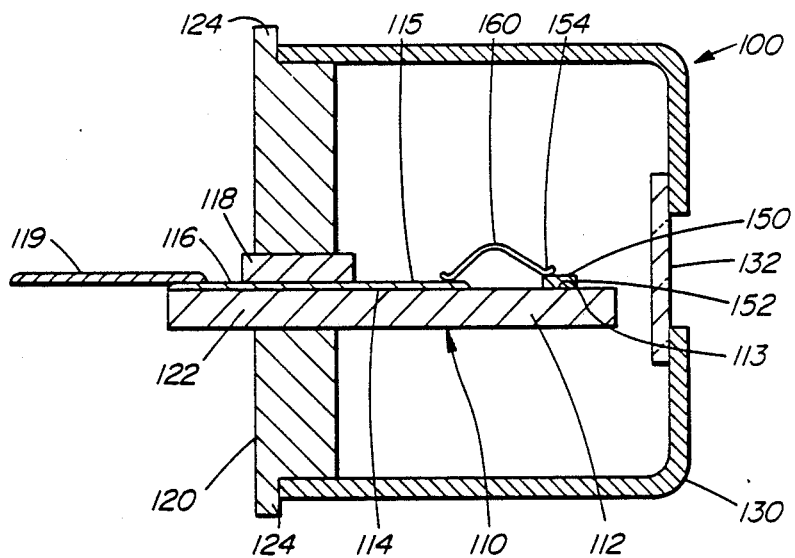
FIG. 1 is a cross-sectional view of an edge-coupled optoelectronic device mounted in a package according to a first embodiment of the invention.
Figure 2:
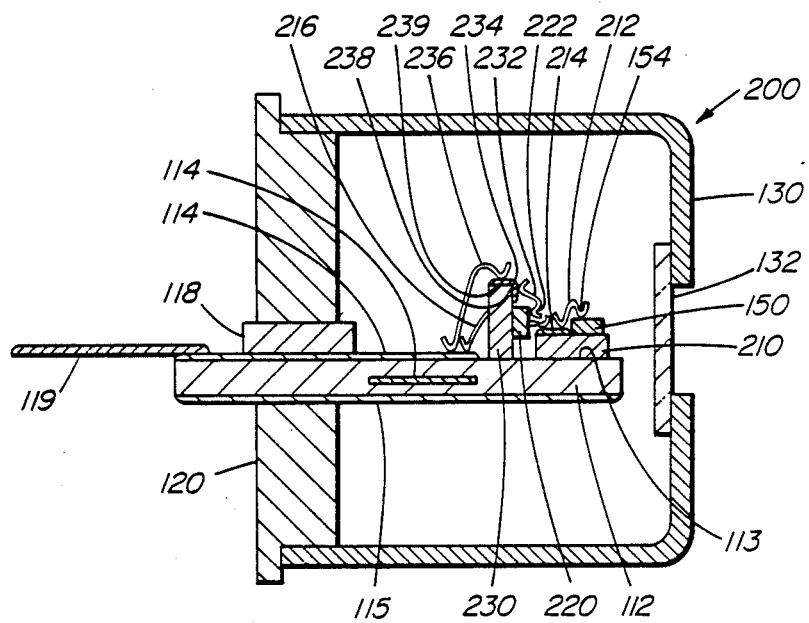
FIG. 2 is a cross-sectional view of an edge-coupled optoelectronic device mounted in a package according to a second embodiment of the invention.

Referring to FIG. 1, a TO-style package 100 according to a first embodiment of the invention comprises a substrate assembly 110, a circular header 120 which has a TO-standard diameter, and a cylindrical cap 130 which has a TO-standard diameter.

The substrate assembly 110 comprises an electrically insulating ceramic substrate 112, electrical conductors in the form of metallic tracks 114 which are supported by the substrate 112 and an electrically insulating cover in the form of a ceramic member 118. The metallic tracks 114 define device contacts 115 which are adjacent to a device support location 113 on the substrate 112 and terminal contacts 116 which are remote from the device support location 113. The metallic tracks 114 extend between corresponding device contacts 115 and terminal contacts 116 to electrically connect respective device contacts 115 to respective terminal contacts 116. The ceramic cover member 118 extends across the metallic tracks 114 between the device contacts 115 and the terminal contacts 116. Metal terminal pins 119 are brazed to the terminal contacts 116. A similar substrate assembly for use in packaging hybrid electronic circuits is described in copending U.S. patent application Ser. No. 275,887 filed Nov. 25, 1988 (Canadian patent application Ser. No. 583,943 filed Nov. 23, 1988) in the names of Tibor Kovats et al.

The circular header 120 has a through opening 122 through which the ceramic substrate 112 and the ceramic cover member 118 extend. The ceramic substrate 112 and the ceramic cover member 118 are secured in the opening 122 by brazing. The circular header 120 also has a peripheral lip 124.

The cylindrical cap 130 fits onto the header 120 over the substrate assembly 110 and is secured to the header 120 at the lip 124 of the header 120 by brazing, welding, soldering or any other securing method which would provide a seal between the header 120 and the cap 130. The cap 130 has a central transparent window 132.

An edge-coupled optoelectronic device in the form of an edge-emitting semiconductor laser 150 is secured to the ceramic substrate 112 at the device support location 113. An emitting edge 152 of the laser 150 is aligned with the window 132 of the cap 130 so that light emitted by the laser 150 is coupled through the window 132. Electrical contacts 154 of the laser 150 are connected to corresponding terminal pins 119 via the metallic tracks 114 and electrical conductors in the form of wires 160 which are wire-bonded at one end to the device contacts 115 of the metallic tracks 114 and wire-bonded at the other end to the contacts 154 of the laser 150.

Normally, the package 100 would be pre-assembled by extending the substrate 112 and cover member 118 of the substrate assembly 110 through the opening 122 of the header 120 and securing them in that opening 122 by brazing. The laser 150 is packaged by securing it to the substrate 112 at the device support location 113 and wire-bonding the wires 160 at the contacts 154 of the laser 150 and at the corresponding device contacts 115 of the substrate assembly 110 to electrically connect the contacts of the laser 150 to respective metallic tracks 114 of the substrate assembly 110. The cap 130 is fitted onto the header 122 over the laser 150 and secured on the header 120 by brazing at the lip 124.

The package 100 and packaging method described above permit electrical connection of an edge-coupled optoelectronic device to terminals of a TO-style package without time consuming and expensive manual soldering or epoxying operations. In particular, the described package and packaging method permit electrical connection of an edge-coupled optoelectronic device to terminals of a TO-style package using only automated wire-bonding operations.

Other automated bonding techniques can be substituted for wire-bonding in the method described above. For example, the wires 160 can be replaced by metallic tracks on a flexible plastic substrate, and the wire-bonding operations can be replaced by Tape Automated Bonding (TAB) operations.

Other modifications are also within the scope of the invention as claimed below. For example, the edge-emitting laser 150 could be replaced by an edge-emitting LED or an edge-receiving photodetector. The edge-coupled optoelectronic device could be mounted on a subcarrier, and the subcarrier could be mounted on the substrate 112 at the device support location 113. Other electronic or optoelectronic devices could be mounted on the same subcarrier as the edge-coupled optoelectronic device. Other electronic or optoelectronic devices could also be mounted on separate subcarriers or directly on the substrate 112. The subcarriers could be provided with bonding pads and metallic tracks for interconnecting the electronic and optoelectronic devices, and bonding techniques such as wire-bonding and TAB could be used to electrically connect such tracks with contacts of the devices and with contacts 115 of the substrate 112. The substrate 112 could have metallic tracks provided at several levels, the metallic tracks at different levels being interconnected through vias where desired, and crossing without interconnection where desired. Such a multilevel substrate could have metallic ground planes at one or more levels to provide electromagnetic shielding or to provide controlled impedance of the metallic tracks. Subcarriers which carry surface-coupled optoelectronic devices could be mounted perpendicular to the substrate 112 for optical coupling through the window 132 or with edge-coupled optoelectronic devices in the same package.

For example, in a package 200 according to a second embodiment of the invention, the edge-emitting laser 150 is mounted on a subcarrier 210 which is mounted at the device support location 113 of the substrate 112. Wire-bonded wires 212 connect contacts 154 of the laser 150 to metallic tracks 214 on the subcarrier 210, and further wire-bonded wires 216 connect the tracks 214 to corresponding tracks 114 on the substrate 112. A surface-receiving photodetector 220 integrated with a monitor circuit is mounted on another subcarrier 230 which extends perpendicular to the substrate 112 behind the laser 150 to monitor operation of the laser 150 by means of its rearward emission. Wire-bonded wires 232 connect contacts 222 of the photodetector 220 to metallic tracks 234 on the subcarrier 230, and further wire-bonded wires 236 connect the tracks 234 to corresponding tracks 114 on the substrate 112. The tracks 234 run over an edge 238 of the subcarrier 230 to an end surface 239 of the subcarrier 230, so that both ends of the wires 236 can be wire-bonded. The substrate 112 is a multilayer ceramic member having metallic tracks 114 at several levels, including a ground plane 115.

I claim:

1. A package for an edge-coupled optoelectronic device, comprising:
    a substrate assembly comprising:
        an electrically insulating substrate;
        electrical conductors which are supported by the substrate, the conductors defining and extending between device contacts which are adjacent to a device support location on the substrate and terminal contacts which are remote from the device support location; and
        an electrically insulating cover which extends across the conductors between the device contacts and the terminal contacts;
    a circular header which has a through opening for receiving the substrate and cover of the substrate assembly; and
    a cylindrical cap for fitting onto the header over the substrate assembly, the cap having a central transparent window.

2. A package as defined in claim 1, wherein the substrate comprises a ceramic substrate, the conductors comprise metallic tracks on the substrate, and the cover comprises a ceramic cover member which extends across the tracks.

3. A package as defined in claim 1, wherein the substrate is a multilayer substrate having conductors at a plurality of levels.

4. A package as defined in claim 1, wherein the substrate carries a conducting ground plane.

5. A package as defined in claim 1, further comprising terminal pins which are electrically connected to respective terminal contacts of the electrical conductors.

6. A package as defined in claim 1, wherein the header and the cap have TO-standard diameters.

7. A package edge-coupled optoelectronic device, comprising:
    a circular header which has a through opening;
    a substrate assembly comprising:
        an electrically insulating substrate;
        electrical conductors which are supported by the substrate, the conductors defining and extending between device contacts which are adjacent to a device support location on the substrate and terminal contacts which are remote from the device support location; and
        an electrically insulating cover which extends across the conductors between the device contacts and the terminal contacts;
    the substrate and the cover extending through and being secured in the opening of the header;
    an edge-coupled optoelectronic device which is secured to the substrate in the device support location, the optoelectronic device having electrical contacts which are electrically connected to respective conductors of the substrate assembly; and
    a cylindrical cap which is secured to the header over the optoelectronic device, the cap having a central transparent window over the optoelectronic device.

8. A packaged device as defined in claim 7, wherein the edge-coupled optoelectronic device is mounted on a subcarrier which is secured to the substrate in the device support location.

9. A packaged device as defined in claim 8, wherein the subcarrier comprises an electrically insulating member and electrical conductors supported by the insulating member; and
    electrical contacts of the edge-coupled optoelectronic device are electrically connected to respective conductors of the substrate assembly by electrical conductors which connect the contacts of the device to respective conductors of the subcarrier and electrical conductors which connect the conductors of the subcarrier to respective conductors of the substrate assembly.

10. A packaged device as defined in claim 9, further comprising a surface-coupled optoelectronic device which is mounted on a subcarrier which is oriented perpendicular to the substrate.

11. A packaged device as defined in claim 10, wherein the subcarrier of the surface-coupled optoelectronic device comprises an electrically insulating member and electrical conductors supported by the insulating member, the electrical conductors extending from a device-carrying surface of the insulating member over an edge of the insulating member to an end surface of the insulating member; and
    electrical contacts of the surface-coupled optoelectronic device are electrically connected to respective conductors of the substrate assembly by electrical conductors which connect the contacts of the device to respective conductors on the device-carrying surface of the subcarrier and electrical conductors which connect conductors on the end surface of the subcarrier to respective conductors of the substrate assembly.

12. A packaged device as defined in claim 10, wherein the edge-coupled optoelectronic device comprises an edge-emitting laser and the surface-coupled optoelectronic device comprises a surface-receiving photodetector which is aligned with and optically coupled to the laser.

13. A packaged device as defined in claim 12, further comprising a monitoring circuit which is mounted to the same subcarrier as the photodetector and which is electrically connected to the photodetector for monitoring the performance of the laser.

* * * * *